March 7, 1950 K. E. FARR 2,499,576

ULTRA HIGH FREQUENCY FREQUENCY CONTROL ARRANGEMENT

Filed May 27, 1947 2 Sheets-Sheet 1

INVENTOR.
KENNETH E. FARR

BY John P. Harvey

ATTORNEY

March 7, 1950 K. E. FARR 2,499,576

ULTRA HIGH FREQUENCY FREQUENCY CONTROL ARRANGEMENT

Filed May 27, 1947 2 Sheets-Sheet 2

INVENTOR.
KENNETH E. FARR

BY John A. Harvey

ATTORNEY

Patented Mar. 7, 1950 2,499,576

UNITED STATES PATENT OFFICE 2,499,576

ULTRA HIGH FREQUENCY FREQUENCY-CONTROL ARRANGEMENT

Kenneth E. Farr, Bayside, N. Y., assignor to Hazeltine Research, Inc., Chicago, Ill., a corporation of Illinois Application May 27, 1947, Serial No. 750,847

8 Claims. (Cl. 250—36)

Figure 1:
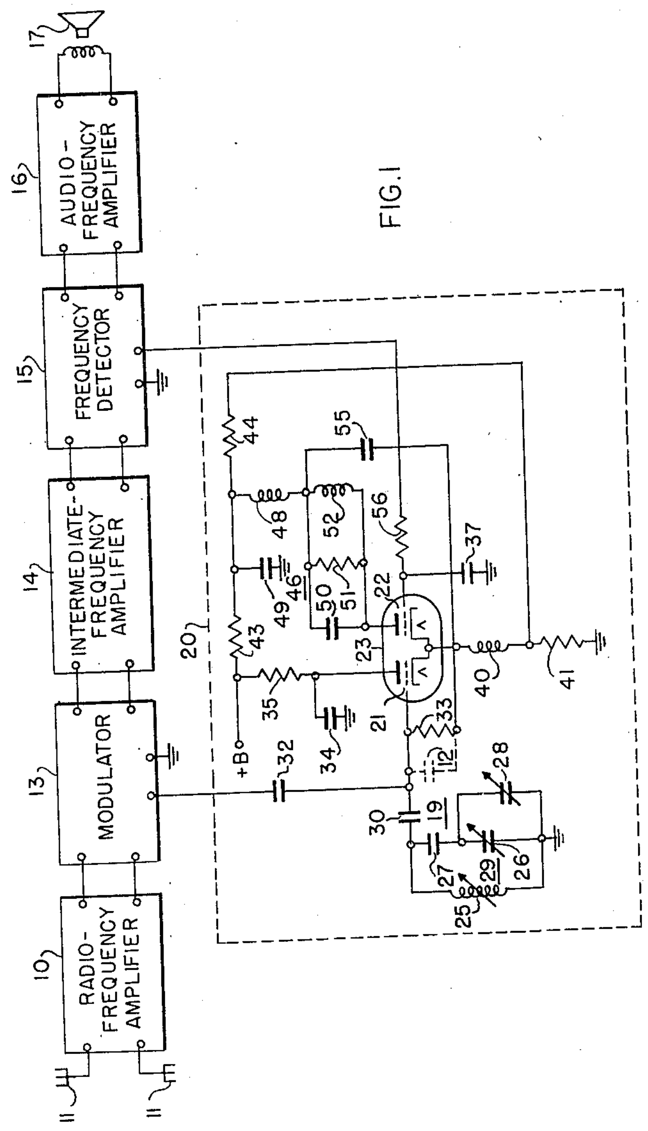

This invention is directed to ultra-high frequency frequency-control arrangements and, more particularly, to arrangements for electrically controlling the frequency of a generator which produces high-frequency wave signals. While the invention has utility in a wide range of applications, it is particularly useful for controlling the frequency of the local oscillations and the related intermediate-frequency signals which are developed in the oscillator-modulator portion of a frequency-modulation superheterodyne receiver. Accordingly, the invention will be described in that connection.

Automatic-frequency-control arrangements of the quadrature phase-shifting network type and, to a considerably more limited extent, arrangements which utilize an amplifier tube wherein the reactance between the input electrodes varies with changes in the transconductance of the amplifier tube, have been employed in radio receivers. The operation of such arrangements has been generally satisfactory for low-frequency applications. However, with the recent frequency allocations for frequency-modulation transmissions which necessitate the operation of frequency-modulation receivers at considerably higher frequencies, for example frequencies of the order of 88 to 108 megacycles, automatic-frequency-control arrangements which heretofore have been employed for local oscillator control in the receiver have proved to be undesirable in these newer bands because of certain difficulties experienced with those arrangements.

It has been determined experimentally that the performance of frequency-control arrangements in the higher frequency range mentioned is influenced by a number of factors including stray circuit reactances, such as stray capacitances and particularly stray inductances present in the connections that couple the frequency-control tube to the tuned circuit of the associated oscillator. Stray circuit capacitances make the design of satisfactory phase-shifting networks, for deriving the necessary quadrature voltages for the control tube, extremely difficult at the frequencies approximately corresponding to those mentioned above. Such capacitances influence conventional phase-shifting networks in a manner to introduce an undesirable resistive component into the tuned circuit of the oscillator, thus undesirably loading the latter. This loading often varies with the frequency of the generated oscillations. The loading effect materially increases the losses in the oscillator tuned circuit and hence may decrease the amplitude of the generated oscillations or may cause the oscillations to vary substantially in amplitude with frequency, thus causing the local oscillator and the equipment coupled thereto to operate unsatisfactorily. Likewise, at the higher frequencies under consideration, the inductances of the cathode leads comprising the conductive connections between the cathode electrodes and the external cathode circuit connections of a frequency-control arrangement present another serious problem since these inductances are effective to develop an apparent resistance in the tuned circuit of the oscillator unit of the arrangement, which resistance may also undesirably load the oscillator. Furthermore, these inductances reduce the extent of the apparent reactance which can be introduced into the tuned circuit of the oscillator by the frequency-control tube, thus undesirably limiting the sensitivity of the frequency-control arrangement.

It is an object of the invention, therefore, to provide a new and improved ultra-high frequency frequency-control arrangement, for use at very high frequencies, which avoids one or more of the disadvantages and limitations of prior frequency-control arrangements operated at these high frequencies.

It is another object of the invention to provide a new and improved ultra-high frequency frequency-control arrangement, for use at very high frequencies, which has high sensitivity and thus is adapted to provide a relatively large range of values of simulated reactance for a relatively small range of control potentials.

It is still another object of the present invention to provide a new and improved ultra-high frequency frequency-control arrangement, for use at very high frequencies, which minimizes the loading of the oscillator thereof over the tuning range of the oscillator, thus providing wave signals of fairly uniform amplitude over the aforesaid range.

It is a further object of the invention to provide a new and improved ultra-high frequency frequency-control arrangement which is adapted for use in the automatic-frequency-control system of a frequency-modulation receiver.

In accordance with a particular form of the invention, an ultra-high frequency frequency-control arrangement comprises an electron tube having a pair of space-current paths and including individual anode and control-electrode elements in each of the paths and a cathode element common to the pair of paths. The arrangement includes means including one of the space-current paths and a frequency-determining circuit which is coupled to at least two of the elements therein for generating high-frequency wave signals. The frequency-control arrangement further includes means for providing between the control-electrode element in the other of the space-current paths and a point on the frequency-determining circuit conductive path having a low inductive impedance for the above-mentioned generated wave signals, effectively to reduce the undesirable loading effect on the frequency-determining circuit caused by any inductive impedance in the conductive path. The arrangement also comprises means including the last-mentioned means, the common cathode element, and the aforesaid other space-current path for introducing a reactive impedance into the frequency-determining circuit from the common cathode element and the control-electrode element of the other space-current path. The frequency-control arrangement additionally includes means for adjusting the trans-conductance of the aforesaid other space-current path to control the magnitude of the above-mentioned reactive impedance and thereby the frequency of the generated wave signals.

For a better understanding of the present invention, together with other and further objects thereof, reference is had to the following description taken in connection with the accompanying drawings, and its scope will be pointed out in the appended claims.

Figure 2:
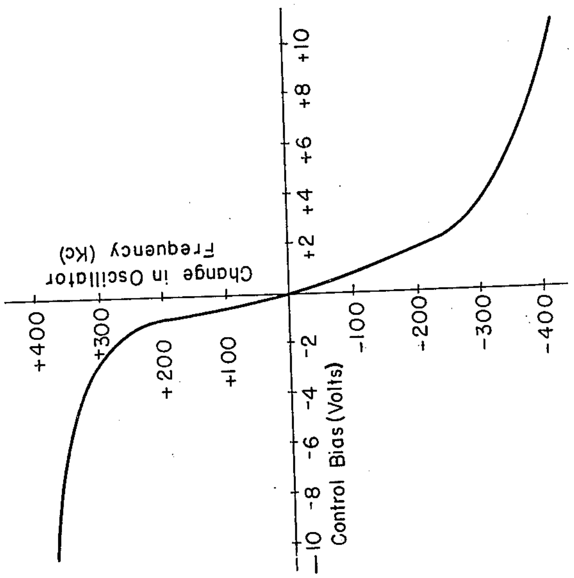
Figure 3:
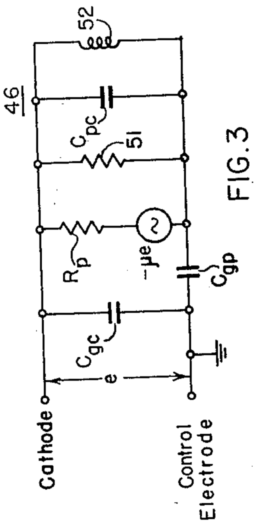
Figure 4:
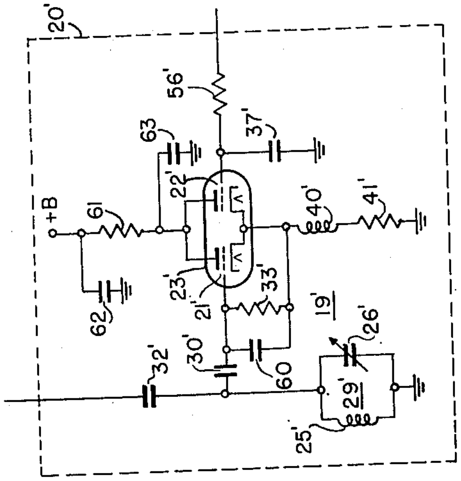

In the accompanying drawings, Fig. 1 is a circuit diagram, partly schematic, of a complete frequency-modulation carrier-signal receiver embodying the present invention; Fig. 2 is a graph representing an operating characteristic of the frequency-control arrangement utilized in the Fig. 1 receiver; Fig. 3 is the equivalent circuit diagram of the Fig. 1 frequency-control arrangement; and Fig. 4 is a schematic circuit diagram of a modified form of the invention.

Referring now more particularly to Fig. 1 of the drawings, there is represented, partly schematically, a complete frequency-modulation carrier-signal receiver having automatic frequency control and embodying the present invention in a particular form. In general, the receiver includes a radio-frequency amplifier 10 having an input circuit connected to an antenna system 11, 11 and having an output circuit connected to a modulator 13 which forms a part of a frequency changer. The frequency changer also includes a local oscillator 19, which will be more fully described hereinafter. Connected in cascade with the modulator 13, in the order named, are an intermediate-frequency amplifier 14 of one or more stages, a frequency detector 15, an audio-frequency amplifier 16 of one or more stages, and a sound reproducer 17. One of the output circuits of the frequency detector 15 is connected to a control circuit of a frequency-control arrangement 20 which includes the oscillator 19 and is described more fully hereinafter. The output circuit of unit 20 is connected to an input circuit of the modulator 13.

It will be understood that the various units just described may, with the exception of the frequency-control arrangement 20, be of conventional construction and operation, the details of which are well known in the art, rendering detailed descriptions thereof unnecessary.

Considering briefly the operation of the receiver as a whole, and neglecting for the moment the exact details of the operation of the frequency-control arrangement 20 presently to be described, a desired frequency-modulated carrier signal is intercepted by the antenna system 11, 11, selected and amplified by the radio-frequency amplifier 10, converted to an intermediate-frequency signal by the frequency changer comprising the modulator 13 and the oscillator 19, amplified in the intermediate-frequency amplifier 14, and detected by the frequency detector 15, thereby to derive the audio-frequency modulation components. The audio-frequency components are, in turn, amplified in the audio-frequency amplifier 16 and are reproduced by the sound reproducer 17 in a conventional manner.

It will be understood that the detector 15 of the receiver preferably is not responsive to undesired amplitude-modulation components in the received carrier signal or that the unit 14 may include a conventional form of amplitude limiter. In the operation of the receiver, the frequency of the signal applied by the oscillator 19 to the modulator 13 may not have the correct frequency due to oscillator drift, misadjustment of oscillator tuning, or other causes so that the intermediate-frequency output signal of the modulator 13 does not have a mean frequency corresponding to the frequency to which the intermediate-frequency amplifier 14 is tuned. In this case, a control voltage having a magnitude and polarity varying with the extent and direction of the oscillator mistuning is applied by the frequency detector 15 to the frequency-control arrangement 20. The latter supplies a suitable reactive impedance in parallel with the tuned circuit of the oscillator 19 effective to correct the frequency of the output signal thereof, so that the intermediate-frequency signal is adjusted automatically to a frequency near its proper value. In this manner, any inaccuracies in the tuning of the receiver are corrected as well as any frequency drift of the oscillator 19.

Referring now more particularly to the portion of the receiver comprising the present invention, the frequency-control arrangement 20 comprises a pair of electron-tube structures 21 and 22, each having anode, cathode, and control-electrode elements. Preferably, the electron-tube structures 21 and 22 comprise a single electron tube in the form of a duplex triode 23 having a pair of space-current paths, one path for each electron-tube structure or triode section. The duplex triode 23 includes a cathode element which is common to each of the pair of space-current paths. In an actual duplex triode, this cathode element is ordinarily in the form of a common cathode sleeve.

The frequency-control arrangement also comprises means including one of the electron-tube structures, namely the triode 21, and a frequency-determining circuit 29 coupled to at least two of the electrode elements of triode 21 for generating high-frequency wave signals which may have any selected frequency in a relatively wide range of high frequencies. This means is the above-mentioned local oscillator 19 which has as the frequency-determining circuit 29 thereof a parallel-resonant circuit comprising a winding 25 and a series combination of condensers 26 and 27 that are connected in shunt with the winding 25. Condenser 26, which is adjustable for tuning the oscillator 19 to any selected frequency in the above-mentioned range thereof, has a trimmer condenser 28 connected in parallel therewith. The frequency-determining circuit 29 has one point thereon connected directly to ground, which may conveniently comprise the chassis of the frequency-control arrangement. The high-potential point of the circuit 29 for generated wave signals is connected to the control-electrode element of the triode 21 through a coupling condenser 30. This control-electrode element is also connected to an input terminal of the modulator 13 through a coupling condenser 32 and is connected to the common cathode of tube 23 through a grid resistor 33. The control electrode-cathode inherent capacitance of the triode 21 is represented by the condenser 12 shown in broken lines. The anode of triode 21 is connected to ground through a by-pass condenser 34 and to a source +B through a resistor 35. The common cathode is connected to ground through a radio-frequency choke 40 and a resistor 41 which has a relatively low value, the choke 40 being effective to maintain the cathode at a potential above ground for the generated wave signals. The high-potential terminal of the resistor 41 is connected to the source +B through voltage-dropping resistors 43 and 44, for a purpose to be explained subsequently.

The frequency-control arrangement also includes means for providing between the cathode elements, which in the described arrangement comprise the common cathode elements of tube 23, and between the control-electrode element of the triode 22 and a point of the frequency-determining circuit, namely the grounded point thereof, a pair of paths having low inductive impedances for the generated wave signals effectively to reduce the undesirable loading effect on the frequency-determining circuit caused by any inductive impedance in this last-mentioned pair of paths. This loading effect will be explained in detail subsequently. It will be manifest that, in view of the common cathode structure of the tube 23, any inductive impedance between the effective cathode areas of the triodes 21 and 22 is minimized. Aside from this common cathode structure, the means last mentioned comprises a by-pass condenser 37 having a very low impedance for the high-frequency signals generated by the oscillator 19. The condenser 37 has short low-impedance leads connecting the control electrode of the tube structure 22 to ground to minimize the inductive impedance between the control electrode of triode 22 and the low-potential terminal of the circuit 29.

The frequency-control arrangement further includes means comprising the described low inductive paths and the triode 22 for introducing a reactive impedance into the frequency-determining circuit 29 from the cathode and the control-electrode element of the triode 22. The latter, which functions as an amplifier, includes a broad-band parallel-resonant anode load impedance 46 which is approximately resonant at the mid-frequency of the tuning range of the oscillator 19. The anode load impedance 46 is connected between the anode of the triode 22 and the junction point of the resistors 43 and 44 through a radio-frequency choke 48, the aforesaid junction point being by-passed to ground through a condenser 49. The load impedance 46 includes the parallel combination of a damping resistor 51, a winding 52, a condenser 50 and the inherent control electrode-anode capacitance of the triode 22. The impedance of this combination should be sufficiently high to maximize the changes in the input capacitance of the triode 22 with changes in the transconductance thereof. The anode load impedance 46 is preferably resonant at approximately the mid-frequency of the tuning range of the oscillator 19 in order to minimize the changes in the input conductance of the triode 22 as the frequency of the oscillator is varied over its range. The Q of the anode load impedance 46, which is influenced by the damping resistor 51, preferably should be rather low also to minimize variations of the conductance and capacitance of the anode load impedance 46 with changes in the frequency of the wave signals developed by the oscillator 19. The condenser 50 has a capacitance sufficient, however, to prevent the winding 52 from becoming series resonant with the control electrode-anode capacitance of the triode 22 in the band of operating frequencies over which the oscillator 19 is tunable. A condenser 55 having a low impedance for the generated wave signals is connected between the junction of the inductors 48 and 52 and the common cathode of the tube 23 for a purpose to be explained hereinafter. The operating potential of the source +B and the value of the resistors 41, 43, and 44 are so selected that the triode 22 has normal operating potentials applied thereto.

The frequency-control arrangement further includes means for adjusting the transconductance of the triode 22 to control the magnitude of the reactive impedance introduced into the frequency-determining circuit 29 from the cathode and control-electrode elements of the triode 22. This means preferably comprises the control electrode of the triode 22 to which a unidirectional control potential, preferably having positive and negative values with respect to ground, is supplied through a resistor 56 from an output circuit of the frequency detector 15.

Considering now the operation of the frequency-control arrangement just described, the oscillator 19 is of conventional arrangement and generates high-frequency wave signals which may have any selected frequency within a relatively wide range of high frequencies. The frequency of these wave signals is determined by the resonant frequency of the tuned circuit 29 as modified by any reactive impedance introduced therein from the cathode and the control-electrode elements of the triode 22 which are coupled thereto through the condenser 37 and the control electrode-cathode capacitance 12 of the triode 21. The triode 22, which constitutes an amplifier for the high-frequency signals applied between its cathode and control-electrode elements from the oscillator 19, is effective in the well-known manner to develop between the last-mentioned elements an input impedance which varies with the transconductance of the tube. When no unidirectional control potential is applied to the control electrode of the triode 22 from the frequency detector 15, this input impedance has an initial value which determines in part the selected operating frequency of the oscillator 19.

When the frequency of the local oscillator 19 deviates for any of the reasons mentioned above from the selected frequency required to produce the correct value of mean frequency of the intermediate frequency at the output terminals of the modulator 13, a control potential having a magnitude and polarity dependent upon the respective extent and direction of the deviation is applied by the unit 15 between the control electrode of the triode 22 and ground. This control potential alters the transconductance of the triode 22 and thereby the magnitude of the reactive impedance which is applied by the triode 22 to the frequency-determining circuit 29 of the oscillator 19. The frequency of the local oscillator is thereby altered, in the manner represented in the curve of Fig. 2, to the extent required to produce substantially the correct value of mean frequency of the intermediate-frequency signal.

Any positive resistive component appearing in the input impedance of the triode 22 has a loading effect on the frequency-determining circuit 29 and is undesirable in that it reduces the amplitude of the generated wave signals and tends to render the oscillator 19 unstable. Reducing the inductive impedance of the path between the cathodes of the oscillator tube and the control tube of the frequency-control arrangement, preferably by employing a common cathode as described above, is effective to reduce this phase shift and to diminish this loading effect. Likewise, reducing the inductive impedance between the control-electrode element of triode 22 and the grounded point of the frequency-determining circuit 29 decreases the extent of the loading and hence affords better operation over the frequency range of the oscillator 19. The common cathode structure for the triodes 21 and 23 also affords a tighter coupling between the oscillator 19 and the control tube arrangement, thus providing a relatively large change in the frequency of the oscillator 19 for small changes in the control potential applied to the control tube 22 from the frequency detector 15.

The character of the anode load impedance of the frequency-control triode 22 over the range of control potentials which are applied to the control electrode thereof also influences the loading, and hence the operation of the oscillator 19. A resistive anode load impedance such as that afforded by the impedance 46 at the mid-frequency of the range of the oscillator 19 results in a high value of input-electrode resistance for the tube 22 and, hence, little loading of the frequency-determining circuit 29 at the aforesaid mid-frequency. Any change in the frequency of the local oscillator from its mid-band frequency is effective to alter somewhat a characteristic of the tuned anode load impedance 46. The anode load impedance 46 is represented more clearly in the equivalent circuit of Fig. 3 and effectively comprises the parallel-resonant combination of the resistor 51, the winding 52, and the capacitance $C_{pc}$. The latter comprises the parallel combination of the anode-cathode capacitance of the triode 22 and the capacitance of the condenser 50. The resistor 51 causes the anode load impedance 46 to have a phase characteristic which is substantially a straight line having a rather small slope over the entire tuning range of the oscillator 19. Consequently at frequencies which are above or below the resonant frequency of the anode load impedance 46 and within the aforesaid tuning range, the anode load impedance is effective to provide a high input resistance for the triode 22. Accordingly, oscillator 19 suffers little disturbance from loading effects over the tuning range thereof. Thus the control tube 22 with its broadly tuned anode load impedance 46 constitutes a relatively simple arrangement for producing a fairly uniform change in the capacitive reactance which is developed between the input electrodes of the control tube 22 and is applied to the frequency-determining circuit 29 of the oscillator 19 over the operating frequency range thereof.

The condenser 55 maintains a low-impedance path for high-frequency wave-signal currents between the anode load impedance 46 and the cathode of the triode 22 thereby eliminating the flow of these high-frequency currents through the cathode resistor 41. The condenser 55 thus further tends to reduce the input conductance of the control tube 22 and thereby its loading effect on the frequency-determining circuit 29 of the oscillator 19. The resulting small loading effect does not materially decrease the amplitude of the output signal of the oscillator 19 for application of the modulator 13.

Raising or lowering the anode potential of the frequency-control triode 22 within limits will increase or decrease, respectively, the extent of the frequency control of the oscillator 19 which is afforded by the frequency-control tube.

While applicant does not intend to limit the invention to any specific circuit constants, the following circuit constants are given as illustrative of one embodiment of the invention constructed in accordance with the arrangement of Fig. 1:

Tube 23—6J6 duplex triode
Resistor 33—22 kilohms
Resistors 35 and 44—8.2 kilohms
Resistor 41—150 ohms
Resistor 43—15 kilohms
Resistor 51—680 ohms
Resistor 56—1 megohm
Condenser 26—30 micromicrofarads maximum
Condenser 27—25 micromicrofarads
Condenser 28—7 micromicrofarads maximum
Condenser 30—50 micromicrofarads
Condensers 34, 37, 49 and 55—500 micromicrofarads
Condenser 50—2 micromicrofarads
Chokes 40 and 48—77 turns of No. 34 enameled copper wire 5/8 inch long by 3/16 inch diameter
Winding 25—5 turns of 0.003 inch copper strip 3/16 inch wide, 3/8 inch diameter, 1.6 inches long. Powdered iron slug 1.5 inches long and 0.309 inch diameter
Oscillator 19 frequency range—88 to 108 megacycles
Frequency control over oscillator 19—approximately ±350 kilocycles
+B—250 volts
Bias voltage from unit 15—approximately ±10 volts maximum Referring now to Fig. 4 of the drawings, there is represented a modified frequency-control arrangement which is essentially similar to that of Fig. 1, corresponding elements being designated by the same reference numerals primed. Accordingly, the principal differences only will be mentioned. A coupling condenser 60 is preferably connected between the control electrode of the triode 21′ and the cathode thereof so that oscillations having relatively high amplitudes are developed by the oscillator 19′. The anodes of the triodes 21′ and 22′ are connected to a source indicated +B through a resistor 61 which is by-passed at each end thereof by by-pass condensers 62 and 63, respectively.

The operation of the Fig. 4 frequency-control arrangement is essentially similar to that of the embodiment represented in Fig. 1. Reactance variations between the control electrode and the cathode of the control tube 22′, with changes in the magnitude of the unidirectional control potential applied from the frequency detector, are due to changes in the electron distribution between the control electrode and the cathode of tube 22′. These variations are applied to the frequency-determining circuit 29′, in the manner described in connection with the Fig. 1 embodiment, to alter the frequency of the oscillator 19'. A bias developed across the cathode resistor 41' is effective to establish the operation of the control tube 22' at approximately the center of its control-electrode voltage-anode-current characteristic. In view of the by-pass condenser 63 between the anode of the tube 22' and ground, the gain of the control tube 22' is small. This reduces the magnitude of the reactive impedance which may be impressed by the control tube on the frequency-determining circuit 29' of oscillator 19'. Hence the arrangement of Fig. 4 is not as sensitive as that of the arrangement represented in Fig. 1, but nevertheless has utility in those applications wherein less sensitivity is desired or may be tolerated.

From the foregoing description of the invention, it will be apparent that a frequency-control arrangement embodying the present invention is particularly useful for operation at very high frequencies where it is characterized by high sensitivity. The frequency-control arrangement of the instant invention has particular utility as the frequency-control arrangement in an automatic-frequency-control system of a frequency-modulation wave-signal receiver.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An ultra-high frequency frequency-control arrangement comprising: an electron tube having a pair of space-current paths and including individual anode and control-electrode elements in each of said paths and a cathode element common to said pair of paths; means including one of said space-current paths and a frequency-determining circuit which is coupled to at least two elements therein for generating high-frequency wave signals; means for providing between the control-electrode element in the other of said space-current paths and a point on said frequency-determining circuit a conductive path having a low inductive impedance for said generated wave signals effectively to reduce the undesirable loading effect on said frequency-determining circuit caused by any inductive impedance in said conductive path; means including said last-mentioned means, said common cathode element, and said other space-current path for introducing a reactive impedance into said frequency-determining circuit from said common cathode element and said control-electrode element in said other space-current path; and means for adjusting the transconductance of said other space-current path to control the magnitude of said reactive impedance and thereby the frequency of said generated wave signals.

2. An ultra-high frequency frequency-control arrangement comprising: an electron tube having a pair of space-current paths and including individual anode and control-electrode elements in each of said paths and a cathode element common to said pair of paths; means including one of said space-current paths and a frequency-determining circuit which is coupled to at least two elements therein for generating high-frequency wave signals which may have any selected frequency within a relatively wide range of high frequencies; means for providing between the control-electrode element in the other of said space-current paths and a point on said frequency-determining circuit a conductive path having a low inductive impedance for said generated wave signals effectively to reduce the undesirable loading effect on said frequency-determining circuit caused by any inductive impedance in said conductive path; means including said last-mentioned means, said common cathode element, and said other space-current path for introducing a reactive impedance into said frequency-determining circuit from said common cathode element and said control-electrode element in said other space-current path; a broad-band parallel-resonant anode load impedance for said other space-current path resonant at approximately the mid-frequency of said range; means for providing a low-impedance path between a point on said anode load impedance and said common cathode for said generated wave signals; and means for adjusting the transconductance of said other space-current path to control the magnitude of said reactive impedance and thereby to vary the frequency of said generated wave signals with respect to said any frequency.

3. An ultra-high frequency frequency-control arrangement comprising: an electron tube having a pair of space-current paths and including individual anode and control-electrode elements in each of said paths and a cathode element common to said pair of paths; means including one of said space-current paths and a frequency-determining circuit which is coupled to at least two elements therein for generating high-frequency wave signals which may have any frequency within a relatively wide range of high frequencies; means for providing between the control-electrode element in the other of said space-current paths and a point on said frequency-determining circuit a conductive path having a low inductive impedance for said generated wave signals effectively to reduce the undesirable loading effect on said frequency-determining circuit caused by any inductive impedance in said conductive path; means including said last-mentioned means, said common cathode element, and said other space-current path for introducing a reactive impedance into said frequency-determining circuit from said common cathode element and said control-electrode element in said other space-current path; and means for adjusting the transconductance of said other space-current path to control the magnitude of said reactive impedance and thereby the frequency of said generated wave signals with respect to said any frequency in said range.

4. An ultra-high frequency frequency-control arrangement comprising: an electron tube having a pair of space-current paths and including individual anode and control-electrode elements in each of said paths and a cathode element common to said pair of paths; means including one of said space-current paths and a frequency-determining circuit which is coupled to at least two elements therein for generating high-frequency wave signals; means for providing between the control-electrode element in the other of said space-current paths and a point on said frequency-determining circuit a conductive path having a low inductive impedance for said generated wave signals effectively to reduce the undesirable loading effect on said frequency-determining circuit caused by any inductive impedance in said conductive path; said control-electrode element in said other of said space-current paths and said point on said frequency-determining circuit being effectively at ground potential for said generated wave signals; means for maintaining said common cathode elements at a higher potential for said generated wave signals than said ground potential; means including said last-mentioned means, said common cathode element, and said other space-current path for introducing a reactive impedance into said frequency-determining circuit from said common cathode element and said control-electrode element in said other space-current path; means connected between said maintaining means and ground normally for maintaining the operation of the electron-tube portion having said other space-current path at the center of its control-electrode voltage anode-current characteristic; and means for adjusting the transconductance of said other space-current path to control the magnitude of said reactive impedance and thereby the frequency of said generated wave signals.

5. An ultra-high frequency frequency-control arrangement comprising: an electron tube having a pair of space-current paths and including individual anode and control-electrode elements in each of said paths and a cathode element common to said pair of paths; means including one of said space-current paths and a frequency-determining circuit which is coupled to at least two elements therein for generating high-frequency wave signals; means for providing between the control-electrode element in the other of said space-current paths and a point on said frequency-determining circuit a conductive path having a low inductive impedance for said generated wave signals effectively to reduce the undesirable loading effect on said frequency-determining circuit caused by any inductive impedance in said conductive path; means including said last-mentioned means, said common cathode element, and said other space-current path for introducing a reactive impedance into said frequency-determining circuit from said common cathode element and said control-electrode element in said other space-current paths; a fixed-tuned anode load impedance for the electron-tube portion having said other space-current path and resonant at approximately the mid-frequency of said range; and means for adjusting the transconductance of said other space-current path to control the magnitude of said reactive impedance and thereby the frequency of said generated wave signals.

6. An ultra-high frequency frequency-control arrangement comprising: an electron tube having a pair of space-current paths and including individual anode and control-electrode elements in each of said paths and a cathode element common to said pair of paths; means including one of said space-current paths and a frequency-determining circuit which is coupled to at least two elements therein for generating high-frequency wave signals; means for providing between the control-electrode element in the other of said space-current paths and a point on said frequency-determining circuit a conductive path having a low inductive impedance for said generated wave signals effectively to reduce the undesirable loading effect on said frequency-determining circuit caused by any inductive impedance in said conductive path; means including said last-mentioned means, said common cathode element, and said other space-current path for introducing a reactive impedance into said frequency-determining circuit from said common cathode element and said control-electrode element in said other space-current path; a parallel-resonant anode load impedance having a relatively low Q, for the electron-tube portion having said other space-current path, and being resonant at approximately the mid-frequency of said range; and means for adjusting the transconductance of said other space-current path to control the magnitude of said reactive impedance and thereby the frequency of said generated wave signals.

7. An ultra-high frequency frequency-control arrangement comprising: a dual-triode type of electron tube having a common cathode sleeve; a resonant circuit coupled to a pair of electrodes of one triode section of said tube for generating high-frequency wave signals; an impedance having a low value of inductive impedance coupled between the control electrode of the other triode section of said tube and a point on said resonant circuit for providing a low inductive impedance path therebetween for said generated wave signals effectively to reduce the undesirable loading effect on said resonant circuit caused by any inductive impedance in said path, said control electrode and said point on said resonant circuit being effectively at ground potential for said generated wave signals; a winding coupled between said common cathode sleeve and ground and having a high impedance for said generated wave signals for maintaining said common cathode sleeve at a higher potential for said generated wave signals than said ground potential; a resistor coupled between said winding and ground normally for maintaining the operation of said other triode section of said tube at the center of its control-electrode voltage anode-current characteristic; means including said common cathode sleeve, said impedance, and said other triode section of said tube for introducing a reactive impedance into said resonant circuit from said common cathode sleeve and said control electrode; and means for adjusting the transconductance of said other triode section of said tube to control the magnitude of said reactive impedance and thereby the frequency of said generated wave signals.

8. An ultra-high frequency frequency-control arrangement comprising: a dual-triode type of electron tube having a common cathode sleeve; a resonant circuit coupled to a pair of electrodes of one triode section of said tube for generating high-frequency wave signals; an impedance having a low value of inductive impedance coupled between the control electrode of the other triode section of said tube and a point on said resonant circuit for providing a low inductive impedance path therebetween for said generated wave signals effectively to reduce the undesirable loading effect on said resonant circuit caused by any inductive impedance in said path, said control electrode and said point on said resonant circuit being effectively at ground potential for said generated wave signals; a winding coupled between said common cathode sleeve and ground and having a high impedance for said generated wave signals for maintaining said common cathode sleeve at a higher potential for said generated wave signals than said ground potential; a resistor coupled between said winding and ground normally for maintaining the operation of said other triode section of said tube at the center of its control-electrode voltage anode-current characteristic; means including said common cathode sleeve, said impedance, and said other triode section of said tube for introducing a reactive impedance into said resonant circuit from said common cathode sleeve and said control electrode; a resonant circuit, having a resistor in parallel therewith, included in the anode circuit of said other triode section of said tube and resonant at a frequency in said range; and means for adjusting the transconductance of said other triode section of said tube to control the magnitude of said reactive impedance and thereby the frequency of said generated wave signals.

KENNETH E. FARR.

REFERENCES CITED

The following references are of record in the file of this patent:

UNITED STATES PATENTS

| Number | Name | Date |
|---|---|---|
| 2,241,569 | Zakarias | May 13, 1941 |
| 2,258,470 | Rath | Oct. 7, 1941 |
| 2,323,598 | Hathaway | July 6, 1943 |
| 2,382,615 | Donley | Aug. 14, 1945 |
| 2,394,427 | Clark | Feb. 5, 1946 |